US009927292B2

(12) United States Patent
Liebenberg

(10) Patent No.: US 9,927,292 B2
(45) Date of Patent: Mar. 27, 2018

(54) BEAM POSITION SENSOR

(71) Applicant: ASML Netherlands B.V., Veldhoven (NL)

(72) Inventor: Christo Liebenberg, San Marcos, CA (US)

(73) Assignee: ASML Netherlands B.V., Veldhoven (NL)

( * ) Notice: Subject to any disclaimer, the term of this patent is extended or adjusted under 35 U.S.C. 154(b) by 251 days.

(21) Appl. No.: 14/694,635

(22) Filed: Apr. 23, 2015

(65) Prior Publication Data

US 2016/0313179 A1    Oct. 27, 2016

(51) Int. Cl.
    *G01J 1/42*    (2006.01)
    *B23K 26/04*   (2014.01)
    *G03F 7/20*    (2006.01)

(52) U.S. Cl.
    CPC .......... *G01J 1/4257* (2013.01); *B23K 26/043* (2013.01); *G01J 1/429* (2013.01); *G03F 7/70258* (2013.01)

(58) Field of Classification Search
    CPC .............. B23K 26/043; G03F 7/70258; G03F 7/70133; G03F 7/7085; G03F 7/70091; G03F 9/7088; G01J 1/0266; G01J 3/0289; G01B 11/27
    See application file for complete search history.

(56) References Cited

U.S. PATENT DOCUMENTS

| | | | |
|---|---|---|---|
| 6,064,517 A * | 5/2000 | Chuang ................. | G02B 13/12 359/351 |
| 7,327,456 B1 * | 2/2008 | Woollam ................ | G01J 1/02 356/364 |
| 7,554,662 B1 | 6/2009 | Liphardt | |
| 2002/0092963 A1 | 7/2002 | Domash et al. | |
| 2003/0038243 A1 | 2/2003 | Yamada | |

(Continued)

FOREIGN PATENT DOCUMENTS

| WO | 2014143900 A2 | 9/2014 | |
|---|---|---|---|
| WO | WO 2014143900 A2 * | 9/2014 | ............ G01S 3/784 |

OTHER PUBLICATIONS

International Search Report and Written Opinion, counterpart PCT Application No. PCT/US2016/027159, dated Aug. 25, 2016, 16 pages total.

(Continued)

*Primary Examiner* — Kenneth J Malkowski
(74) *Attorney, Agent, or Firm* — DiBerardino McGovern IP Group LLC

(57) ABSTRACT

A system includes a plurality of sensors at distinct and separate locations, each of the distinct and separate locations being equidistant from a region that is configured to pass light that propagates along a beam path, the sensors being configured to sense radiation from an optical element positioned to interact with light that propagates on the beam path; and a controller including one or more electronic processors and a computer-readable medium, the computer-readable medium including instructions that, when executed, cause the one or more electronic processors to receive an output from each of the sensors, the output of each sensor including an indication of an intensity of the radiation detected by the sensor, and analyze the received output to determine a position of the light that propagates along the beam path.

30 Claims, 10 Drawing Sheets

(56) References Cited

U.S. PATENT DOCUMENTS

| | | |
|---|---|---|
| 2005/0274897 A1 | 12/2005 | Singer et al. |
| 2006/0151724 A1 | 7/2006 | Honda |
| 2010/0171049 A1 | 7/2010 | Moriya |
| 2013/0043401 A1 | 2/2013 | Graham |
| 2014/0203195 A1 | 7/2014 | Fleurov |
| 2014/0264091 A1 | 9/2014 | Fleurov et al. |

OTHER PUBLICATIONS

James E. Murray et al., "Spatial Filter Issues," Third Annual International Conference on Solid State Lasers for Applications (SSLA) to Inertial Confinement Fusion (ICF), Monterey, California, Jun. 7-12, 1998, 10 pages.

James E. Murray et al., "Spatial Filter Pinhole Development for the National Ignition Facility", Applied Optics, vol. 39, No. 9, Mar. 20, 2000, 16 pages.

"PowerMax-USB/RE Sensors: USB and RS-232 Laser Power Measurement", Coherent, Inc., 2009, 14 pages.

\* cited by examiner

BEAM POSITION SENSOR

TECHNICAL FIELD

The disclosed subject matter relates to a beam position sensor system.

BACKGROUND

An optical system includes optical elements that interact with a beam of radiation that propagates on a beam path. The optical elements can interact with the beam by, for example, reflecting or refracting the beam. The performance of the optical element can depend on the position of the beam relative to the optical element.

SUMMARY

In one general aspect, a system includes a plurality of sensors at distinct and separate locations, each of the distinct and separate locations being equidistant from a region that is configured to pass light that propagates along a beam path, the sensors being configured to sense radiation from an optical element positioned to interact with light that propagates on the beam path; and a controller including one or more electronic processors and a computer-readable medium, the computer-readable medium including instructions that, when executed, cause the one or more electronic processors to receive an output from each of the sensors, the output of each sensor including an indication of an intensity of the radiation detected by the sensor, and analyze the received output to determine a position of the light that propagates along the beam path.

Implementations can include one or more of the following features.

The radiation from an optical element positioned to interact with light that propagates on the beam path can include light reflected from the optical element.

The instructions to analyze the received output to determine a position of the light that propagates on the beam path can include instructions that analyze the received output to determine the position of the light that propagates on the beam path relative to the region.

The instructions to analyze the received output to determine a position of the light that propagates on the beam path can include instructions that analyze the received output to determine the position of the beam path relative to a center of the region.

The plurality of sensors can be positioned along a circumference, with each sensor being radially equidistant from the center of the region. The plurality of sensors can be sensors configured to sense infrared (IR) light. The plurality of sensors can be held in spatially fixed relation to each other at a support, a portion of the support defining the region that is configured to pass light that propagates along the beam path. The region can be an opening that passes through the support.

The plurality of sensors can include at least four sensors, and the instructions to analyze the received output can include instructions to determine a first coordinate of the position of the light that propagates on the beam path relative to the region based on the output of two sensors in a first set of sensors and a second coordinate of the position of the light that propagates on the beam path relative to the region based on the output of two sensors in a second set sensors, the first set of two sensors including two of the at least four sensors and the second set of two sensors including a different two of the at least four sensors. The sensors of the first set of sensors can be positioned on opposite sides of the region along a first direction and the sensors of the second set of sensors can be positioned on opposite sides of the region along a second direction perpendicular to the first direction.

The instructions to analyze the received output can include instructions to determine a first coordinate of the position of the light that propagates on the beam path relative to the region in a first direction based on the output of four of the plurality of sensors and a second coordinate of the position of the light that propagates on the beam path relative to the region in a second direction based on the output of the four of the plurality of sensors.

In some implementations, the system also includes a spatial filter, the spatial filter including a filter opening configured to pass light that propagates along the beam path. The spatial filter can be made of copper.

A support that defines an opening can be placed in the region, and the spatial filter can be received in the opening. The location of each of the plurality of sensors can be equidistant from a center of the filter opening. The spatial filter can be removably received in the opening of the support.

The spatial filter can include sides that extend from the filter opening at angle relative to an axis that intersects the region, with a portion of the filter opening coinciding with a center of the opening of the support. In some implementations, the optical element positioned to interact with light that propagates along the beam path is the spatial filter, and, in these implementations, the sensors are configured to sense light that is reflected from the spatial filter. The optical element positioned to interact with light that propagates along the beam path can be the sides of the spatial filter.

The instructions can include instructions that, when executed, cause the one or more processors to compare the determined position of the beam path to a baseline position, generate a control signal based on the comparison, and adjust the position of the beam path based on the control signal. The instructions to cause the one or more processors to generate a control signal based on the comparison can include instructions, that when executed, generate a control signal that, when applied to one or more components that interacts with light that propagates along the beam path, causes the beam path to move toward the baseline position.

In another general aspect, a light beam is directed along a beam path that intersects one or more optical elements positioned between a target region and a source of the light beam; data indicating an intensity of radiation reflected from one or more of the optical elements that intersect the beam path is received, the data being received from a plurality of sensors that are in separate and distinct locations and equidistant from a region that is configured to pass light that propagates along the beam path; a position of light that propagates on the beam path relative to the region is determined based on the received data; and the position of the light beam is adjusted based on the determined position.

Implementations can include one or more of the following features.

The light beam can include an amplified light beam, and the target region can be configured to receive a target including target material that emits extreme ultraviolet (EUV) light when in a plasma state. The data indicating an intensity of radiation from one or more of the optical elements can be data indicating an intensity of light reflected from one or more of the optical elements.

To determine a position of the beam path relative to the region, a first coordinate that represents the position of light that propagates on the beam path in one dimension can be determined and a second coordinate that represents the position of the beam path in a second dimension can be determined.

The determined position of light that propagates on the beam path can be compared to a baseline position. An amount of correction can be determined based on the comparison. The beam path can be adjusted based on the determined position by generating a control signal that, when applied to any one of the optical elements positioned between the target region and the source of the amplified light beam, moves the optical element by an amount that causes the beam path to move relative to the region by the amount of correction. The amount of correction can include corrections in two orthogonal directions, and adjusting the beam path based on the determined position can include generating a control signal that, when applied to two of the optical elements positioned between the target region and the source of the amplified light beam, moves each of the two optical elements by an amount that causes the beam path to move in the two orthogonal directions relative to the region by the amount of correction.

In another general aspect, a device for an optical system includes a mount including a through-hole and a plurality of sensors positioned at distinct and separate locations along a perimeter of the mount, the plurality of sensors being equidistant from a center of the through-hole; and a filter received in the through-hole, the filter including sides that extend from an opening that coincides with the center of the through-hole. An outer surface of the sides is an optically reflective material, the sides extend from the opening at an angle relative to an axis that passes through the opening, and the sensors are configured to detect light reflected from the outer surface of the sides.

Implementations can include one or more of the following features.

The sides of the filter can define a portion of a cone with the opening coinciding with the apex of the cone. The filter can be made of copper. The filter can be removeably received in the through-hole.

In another general aspect, a device for an optical system includes a mount that defines a through-hole; and a filter received in the through-hole, the filter including sides that extend from an opening that coincides with the center of the through-hole. An outer surface of the sides is an optically reflective material, and the sides extend from the opening at an angle relative to an axis that passes through the opening such that light propagating in a first direction along a beam path that coincides with the axis passes through the hole and light propagating in a second and different direction along the beam path is reflected away from the beam path by the outer surface.

Implementations can include one or more of the following features. The device can include a plurality of sensors positioned at distinct and separate locations along a perimeter of the mount, the plurality of sensors being equidistant from a center of the through-hole. The mount can have a circular perimeter, and the plurality of sensors can be radially equidistant from the center of the through-hole and the opening. The plurality of sensors can be circumferentially equidistant from each other. The filter can be made of copper. The filter can be removeably received in the through-hole.

Implementations of any of the techniques described above may include a beam position sensor, a beam position sensor and a control system, a feedback system, a method of reducing or eliminating back reflections in a drive laser used in a laser produced plasma EUV light source, a method of producing EUV light, a system for retrofitting an EUV light source or an optical lithography system, a method, a process, a device, executable instructions stored on a computer readable medium, or an apparatus. The details of one or more implementations are set forth in the accompanying drawings and the description below. Other features will be apparent from the description and drawings, and from the claims.

DRAWING DESCRIPTION

DETAILED DESCRIPTION

Figure 1:
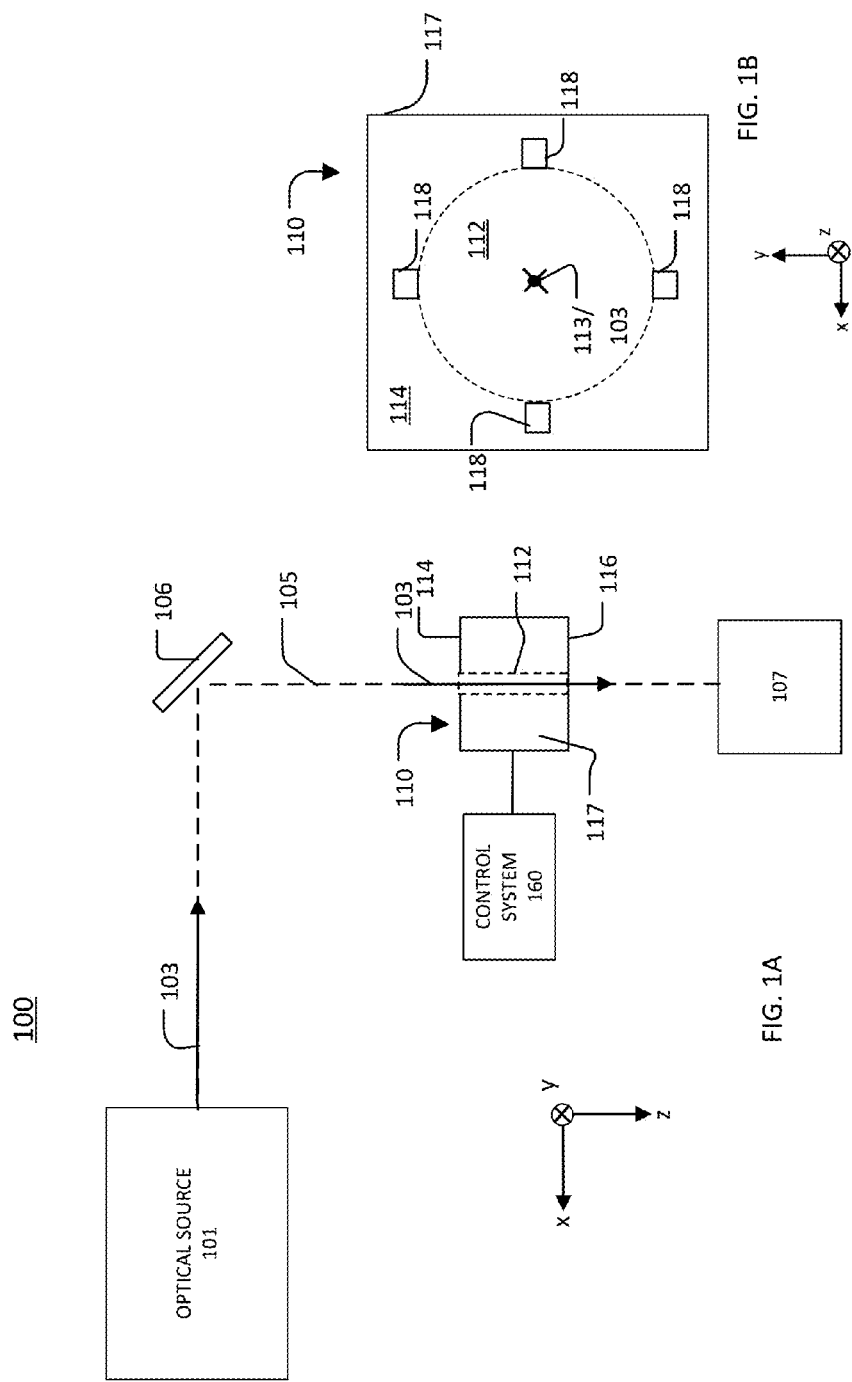
FIG. 1A is a block diagram of a top plan view of an optical system that includes an exemplary beam position sensor.
FIG. 1B is a block diagram of the optical axis view of the beam position sensor of FIG. 1A.

Referring to FIG. 1A, a block diagram of a top plan view of an exemplary system 100 that includes a beam position sensor 110 is shown. FIG. 1B shows a block diagram of the optical axis view of the beam position sensor 110. The system 100 also includes an optical source 101 that emits a light beam 103, which propagates on a beam path 105 (shown with a dashed line) formed between the optical source 101 and an element 107. As discussed in greater detail below, the beam position sensor 110 measures reflected or scattered light at a plurality of sensors 118 to determine the position of the light beam 103 and/or to provide data indicative of the position of the light beam 103 to a control system 160. The reflected or scattered light can be reflected from a portion of an optical element, such as a mirror 106, positioned to interact with light that propagates on the beam path 105.

The beam position sensor 110 includes a region 112 that is transparent, open, or otherwise passes the light beam 103 from a first side 114 of the beam position sensor 110 to a second side 116 of the beam position sensor 110 (FIG. 1B shows the side 114 of the beam position sensor 110). The beam position sensor 110 also includes a support 117, which holds the sensors 118 in a fixed spatial relationship to each other and to the region 112. Because the light beam 103 passes from the first side 114 to the second side 116, the light beam 103 that propagates on the beam path 105 passes through the beam position sensor 110 and reaches the element 107. Thus, the beam position sensor 110 can determine the position of the beam 103 while the system 100 is operating and without interfering with the operation of the system 100 or the element 107.

The element 107 can be any component or physical object that is positioned to interact with or receive the light beam 103 and whose performance depends at least partially on the position of the light beam 103 relative to the element 107. For example, the element 107 can be an electro-optic modulator (EOM), an acousto-optic modulator (AOM), an optical delay cell, an optical amplifier, or an optical assembly, such as a series of lenses and apertures. In another example, the element 107 can be a target material that interacts with the light beam 103 to produce a plasma that emits extreme ultraviolet (EUV) light, and the beam position sensor 110 is used to ensure that the light beam 103 enters a space that receives the target material when the target material is in the space.

Additionally, the beam position sensor 110 can be movable such that it can be used to measure the position of the light beam 103 at any location along the beam path 105. For example, the beam position sensor system 110 can be moved in the x direction to remove the beam position sensor 110 from the beam path 105 or to place the beam position sensor 110 on the beam path 105. In the example shown in FIG. 1A, the beam position sensor 110 is positioned on the path 105 such that the beam 103 passes through the region 112 shortly before reaching the element 107. Thus, position of the beam 103 relative to the region 112 can be used to approximate the position of the beam 103 relative to the element 107, allowing the beam position sensor system 110 to be used to ensure that the light beam 103 is received at an effective location on the element 107.

Referring also to FIGS. 2A-2C, the beam position sensor 110 can be used as part of a feedback system 250 that actively controls the position of a light beam 203 during operation of another exemplary optical system, the optical system 200. FIG. 2A is a block diagram of a side plan view of the optical system 200. FIGS. 2B and 2C show the region 112 at times t1 and t2, respectively. In FIGS. 2B and 2C, the region 112 is shown from the perspective of the optical axis of the beam position sensor 110. The optical axis of the beam position sensor 110 is along the z direction. In the example of FIGS. 2A-2C, the position of the light beam 203 is controlled to remain in the center 113 of the region 112.

In the optical system 200, an optical source 201 emits the light beam 203, which propagates on a beam path 205 (shown with a dashed line) formed between the optical source 201 and an alignment region 207. A steering system 240 is positioned on the beam path 205 between the optical source 201 and the alignment region 207. The steering system 240 includes optical components, such as mirrors and lenses, that, when moved, reposition the beam 203 in the x-y plane. The alignment region 207 can include an optical element that depends on the light beam 203 having a particular position in the x-y plane for optimal performance, or the alignment region 207 can be a region of space that receives an object (such as a droplet of molten metal) that interacts with the light beam 203 at a particular location. The optical system 200 also can include an optical element 206, which can be a mirror or lens, or any other optical element that interacts with the light beam 203 by reflecting or scattering light.

The beam position sensor 110 is positioned on the beam path 205 such that all or part of the light beam 203 passes through the region 112. The feedback system 250 includes a control system 260 that receives data that indicates the position of the light beam 203 relative to the region 112 from the beam position sensor 110. The control system 260 also provides signals to the steering system 240. The control system 260 includes an electronic processor 262, an electronic storage 264, and an input/output (I/O) interface 266. The electronic processor 262 is one or more processors suitable for the execution of a computer program such as a general or special purpose microprocessor, and any one or more processors of any kind of digital computer. Generally, a processor receives instructions and data from a read-only memory or a random access memory or both. The electronic processor 262 can be any type of electronic processor.

The electronic storage 264 can be volatile memory, such as RAM, or non-volatile memory. In some implementations, the electronic storage 264 can include both non-volatile and volatile portions or components. The electronic storage 264 stores instructions, perhaps as a computer program, that, when executed, cause the processor 262 to communicate with other components in the control system 260, the steering system 240, and/or the beam position sensor 110. For example, the instructions can be instructions to generate a voltage signal that is provided to the steering system 240, and, when applied to the steering system 240, the voltage signal causes one or more components of the steering system 240 to move, resulting in the beam 203 being repositioned relative to the region 112.

The I/O interface 266 is any kind of electronic interface that allows the control system 260 to receive and/or provide data and signals with an operator, the beam position sensor 210, the steering system 270, and/or an automated process running on another electronic device. For example, the I/O interface 266 can include one or more of a visual display, a keyboard, or a communications interface.

In the example of FIGS. 2A-2C, the feedback system 250 is used to maintain the light beam 203 at the center 113 of the region 112. At the time t1 (FIG. 2B), measurements from the beam position sensor 110 indicate that the beam 203 is to the left and above the center 113 (from the perspective shown in FIG. 2B). In response, the control system 260 provides signals and/or data to the steering system 240 to steer the beam 203 to the center 113. As shown in FIG. 2C, at the time t2, the beam 203 has moved to the center 113.

Although in the example of FIGS. 2A-2C, the feedback system 250 is used to maintain the beam 203 at the center 113 of the region 112, in other implementations, the feedback system 250 can be used to maintain the beam 203 at any location within the region 112.

Figure 3:
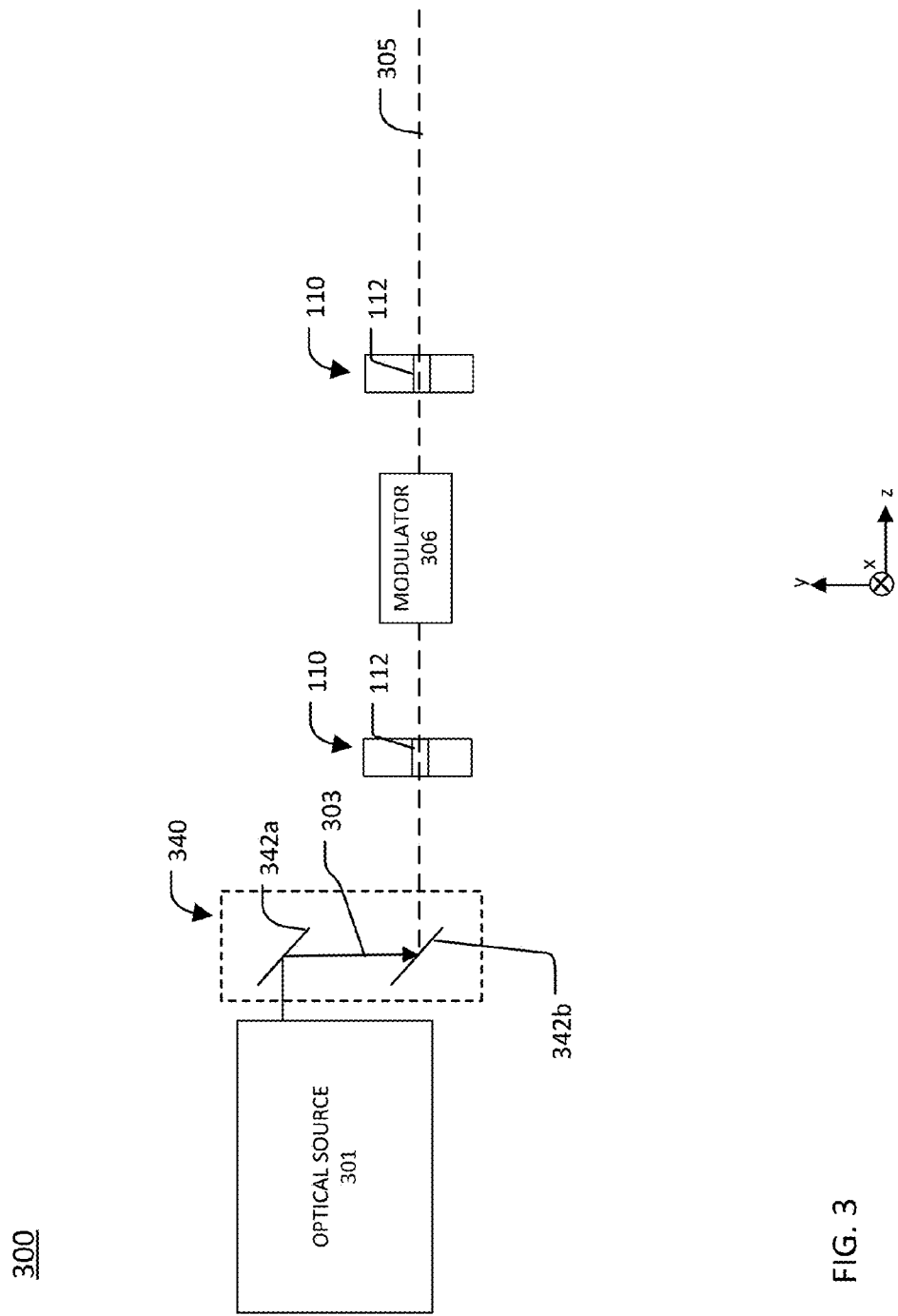
FIG. 3 is a block diagram of an exemplary optical system that includes a plurality of the beam position sensors of FIG. 1A.

Referring also to FIG. 3, a block diagram of an optical system 300 that includes exemplary steering components 342a, 342b on a beam path 305 is shown. The optical system 300 also includes an optical source 301 that emits a light beam 303 onto the beam path 305 (shown with a dashed line). The steering components 342a, 342b can be used as some or all of the components of the steering system 340 in the optical system 200. The steering components 342a, 342b can be reflective optical elements such as mirrors. By manipulating the mirrors 342a, 342b, the position of the beam 303 can be adjusted in the x-y plane. The optical system 300 also includes a modulator 306 positioned on the beam path 305 with beam position sensors 110 on either side of the modulator 306.

Exemplary implementations of the beam position sensor 110 are discussed with respect to FIGS. 4A, 4B, 5A-5C, and 6-8. Any of the beam position sensors 410, 510, 610, 710, and 810 discussed below can be used as the beam position sensor 110.

Figures 4A, 4B:
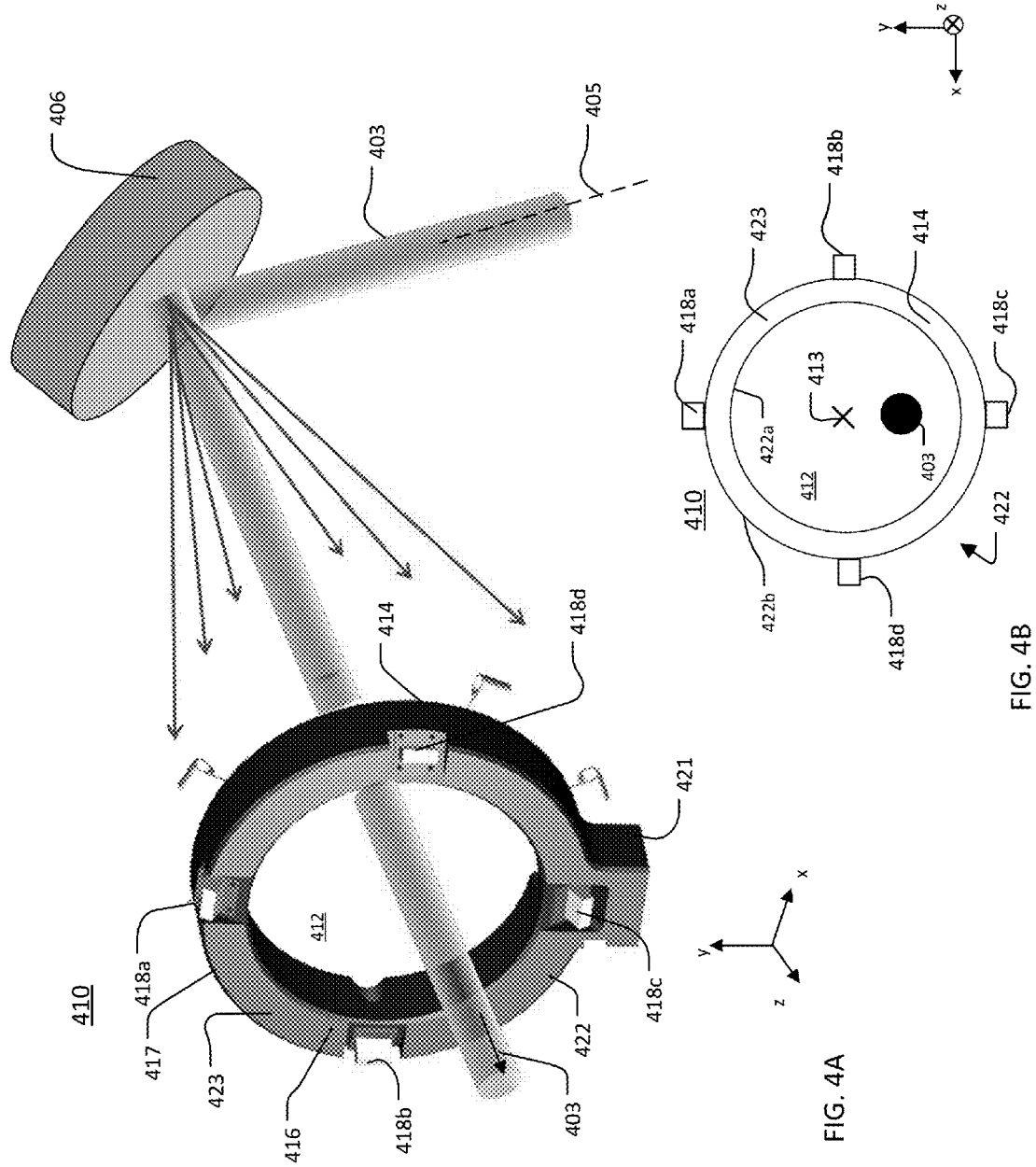
FIG. 4A is a perspective view of an exemplary beam position sensor.
FIG. 4B is a block diagram of the optical axis view of the beam position sensor of FIG. 4A.

Referring to FIG. 4A, a perspective view of an exemplary beam position sensor 410 is shown. The beam position sensor 410 determines a position of a light beam 403 that propagates along a beam path 405. To determine the position of the light beam 403, the beam position sensor 410 uses light reflected from an optical element 406, which is positioned on the beam path 405 and interacts with the beam 403 by reflecting and/or scattering the light 403. The scattering of the light beam can also be interpreted as the thermal radiation from the optical element 406, as a result from heating of the optical element 406 by the light beam 403.

The beam position sensor 410 includes a support 417 that defines a region 412 through which the light beam 403 passes from a side 414 to a side 416. FIG. 4B is a block diagram of the optical axis (the z direction) view from side 414 of the beam position sensor 410. The support 417 includes a base 421, which can be used to, for example, mount the beam position sensor 410 in an optical system (such as any of the optical systems 100, 200, and 300), and a ring 422 that is attached to the base 421. The base 421 and the ring 422 can be integral or separate pieces that are removably connected to each other. The ring 422 has an inner circumference 422a, which forms the perimeter of the region 412, and an outer circumference 422b.

The beam position sensor 410 also includes sensors 418a, 418b, 418c, 418d that are circumferentially spaced and positioned in separate and distinct locations on a mounting portion 423 that extends in the x-y plane between the inner circumference 422a and the outer circumference 422b. The sensors 418a, 418b, 418c, 418d can be in separate and distinct locations by being spaced apart along the mounting portion such that at least two of the sensors 418a, 418b, 418c, 418d image a different portion of the region 412. The sensors 418a, 418b, 418c, 418d are in a fixed spatial relationship with each other and with the region 412.

The sensors 418a, 418b, 418c, 418d are circumferentially equidistant from each other along the outer circumference 422b, and the sensors 418a, 418b, 418c, 418d are radially equidistant from a center 413 of the region 412. The sensors 418a and 418c are on a line that is parallel to the y axis, and the sensors 418b and 418d are on a line that is parallel to the x axis. However, the sensors 418a, 418b, 418c, 418d can be arranged in other configurations. For example, the sensors 418a, 418b, 418c, 418d can be rotated by 45 degrees (°) in the x-y plane. Four sensors are shown in the example of FIGS. 4A and 4B; however, other numbers of sensors can be used.

In the example shown, the region 412 is a region of free space bounded in the x-y plane by the inner circumference 422a. However, the region 412 can include any material that is partially or completely transparent to the wavelengths included in the light beam 403. Thus, the beam 403 propagates from a side 414 to a side 416 of the beam position sensor 410 without interacting with the support 417. In this manner, the beam position sensor 410 is non-invasive and does not interfere or block the light beam 403, allowing the beam position sensor 410 to be used in an optical system in situ (while the optical system is in use).

Figure 5C:
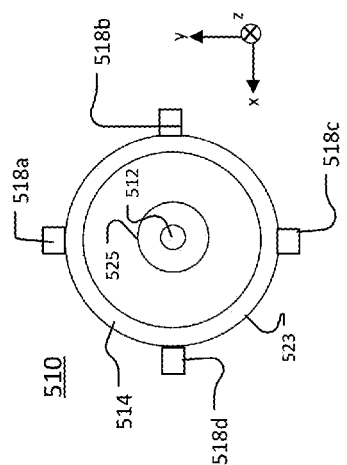
FIG. 5C is a block diagram of a side plan view of the beam position sensor of FIG. 5A.
Figure 5A:
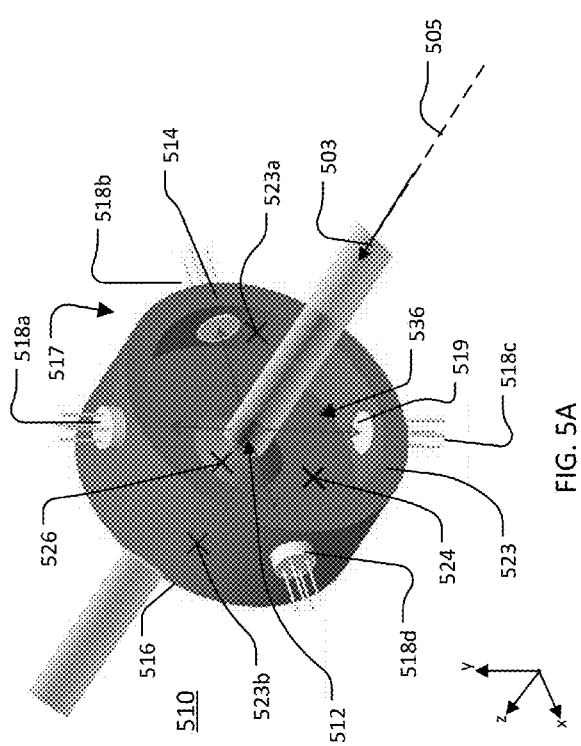
FIG. 5A is a perspective view of another exemplary beam position sensor.
Figure 5B:
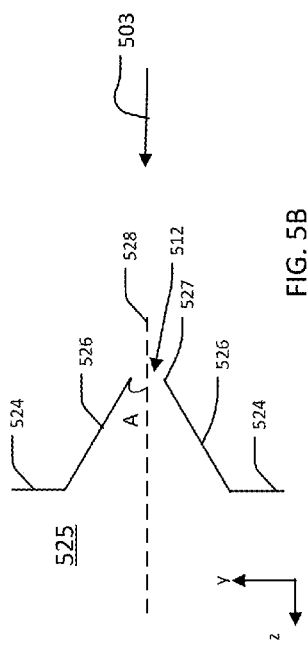
FIG. 5B is the optical axis view of a spatial filter included in the beam position sensor of FIG. 5A.

In the example of FIGS. 4A and 4B, the sensors 418a, 418b, 418c, 418d detect light reflected from the optical element 406, which is separate from the beam position sensor 410, to determine the position of the beam 403. However, in other implementations, such as shown in FIGS. 5A and 5B, light reflected or scattered from a portion of beam position sensor 510 can be used. The sensors 418a, 418b, 418c, 418d can be any type of sensor that detects light at the wavelength or wavelengths of the light beam 403. For example, if the light beam 403 is produced by a carbon dioxide ($CO_2$) laser, the sensors 418a, 418b, 418c, 418d can be thermopiles.

FIG. 5A is a perspective view of another exemplary beam position sensor 510 that passes a light beam 503 through a region 512 from a side 514 to a side 516. FIG. 5B is a side cross-sectional view in the y-z plane of an exemplary spatial filter 525 and the base 524 of the beam position sensor 510. FIG. 5C is a block diagram of the optical axis (the z direction) view from side 514 of the beam position sensor 510.

The beam position sensor 510 includes a support 517 and a spatial filter 525 that defines a region 512 through which a light beam 503 passes. The beam 503 has an extent (beam size) in the x-y plane. In the x-y plane, the intensity distribution of the beam 503 can be approximately Gaussian and can be expressed as a function of radial distance from the center of the beam 503 in Equation (1):

$$I(r) = I_o e^{-\frac{2r^2}{\omega_o}}, \tag{1}$$

where $I_o$ is the intensity at the center of the beam 503, $\omega_o$ is the radius at which the intensity has decreased to $1/e^2$ (0.135) compared to $I_o$, and r is the radial distance from the center. The spatial filter 525 can pass the central portion of the beam 503 through the region 512 and reflect the remaining light in the outer portion of the beam 503. The central portion of the beam 503 may have a higher and/or more uniform intensity than the outer portion of the beam 503. Passing the beam 503 through the spatial filter 525 can result in a beam of higher quality (for example, more uniform intensity in the x-y plane) reaching optical elements that interact with the beam 503 after the beam 503 passes through the beam position sensor 510.

The support 517 of the beam position sensor 510 includes a cylindrical wall 523 that extends from a base 524 in the −z direction. The cylindrical wall 523 has an inner wall 523a that forms a perimeter of a region 536 into which the spatial filter 525 extends. The spatial filter 525 is a partial cone that defines a longitudinal axis 528, which is parallel to the z direction. The spatial filter 525 includes a side 526 that extends from the base 524 along the longitudinal axis 528 and into the region 536. The side 526 slants toward the longitudinal axis 528 at an angle A to form an open apex 527, which defines the region 512.

When the beam 503 reaches the region 512, portions of the beam 503 can interact with the side 526 of the spatial filter 525. For example, if the center of the beam 503 coincides with the center of the region 512, the light in the outer portion of the beam 503 that extends beyond the region 512 in the x-y plane is reflected from the side 526. Due to the angle A that the side 526 forms with the longitudinal axis 528 (which is also parallel to the direction of propagation of the beam 503 as the beam 503 approaches the side 514 and the region 512), the side 526 reflects the light in the outer portion of the beam 503 toward the inner wall 523a while the center portion of the beam 503 passes through the region 512.

Sensors 518a, 518b, 518c, 518d are mounted at the inner wall 523a. The sensors 518a, 518b, 518c, 518d are circumferentially spaced from each other and are in separate and distinct locations along the inner wall 523a. The sensors 518a, 518b, 518c, 518d can be equidistant from each other along the inner wall 523a, and the sensors 518a, 518b, 518c, 518d also can be radially equidistant from a center 513 of the region 512.

Each sensor includes a sensing region 519 (FIG. 5A) that is sensitive to the wavelength or wavelengths in the light beam 503, and the sensing regions 519 are positioned to detect light reflected from the side 526. Each of the sensors 518a, 518b, 518c, and 518d also has an interface that allows access to a representation of an amount of light detected by a particular sensor. In the example of FIG. 5A, the sensors 518a, 518b, 518c, 518d are mounted through the cylindrical wall 523 with the sensing regions 519 oriented toward the side 526 and leads that form the interface extending away from an outer wall 523b of the cylindrical wall 523. This allows the sensors 518a, 518b, 518c, 518d to measure light reflected from the side 526 while also allowing the sensors 518a, 518b, 518c, 518d to be monitored without moving the beam position sensor 510.

In the example of FIGS. 5A and 5B, the sensors 518a and 518c are on a line that is parallel to the y axis, and the sensors 518b and 518d are on a line that is parallel to the x axis. The sensors 518a, 518b, 518c, 518d can be arranged on the inner wall 523a in other configurations.

The sensors 518a, 518b, 518c, 518d can be any type of sensor that detects the wavelengths of the light beam 503. For example, if the light beam 503 is produced by a carbon dioxide ($CO_2$) laser, the sensors 518a, 518b, 518c, 518d can be thermopiles.

The side 526 of the spatial filter 525 can be made of any material that reflects the wavelengths of the light beam 503. For example, the side 526 can be made of a metal such as copper.

Figure 6:
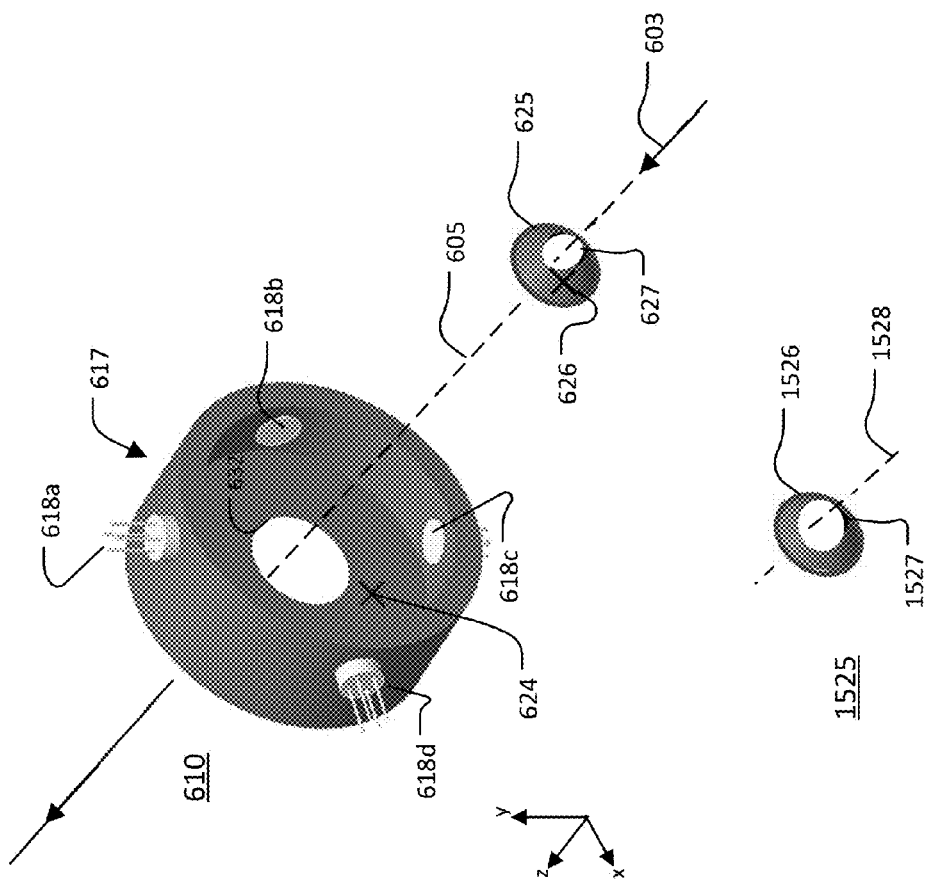
FIGS. 6-8 are perspective views additional exemplary beam position sensors.

Referring to FIG. 6, a perspective view of another exemplary beam position sensor 610 is shown. The exemplary beam position sensor 610 is similar to the beam position sensor 510 (FIGS. 5A-5C), except that the beam position sensor 610 has a removable spatial filter 625 that is received and held in an opening 632 of the base 624. The spatial filter 625 can be removed from the base 624 and replaced with another spatial filter 1525 that has different characteristics than the spatial filter 625. For example, the side 1526 of the spatial filter 1525 can have a different angle A (FIG. 5B) relative to the longitudinal axis 1528 and/or an open apex 1527 with a larger or smaller diameter than the diameter of an open apex 627 of the spatial filter 625. The spatial filter 1527 can be made of a different material than the spatial filter 625.

The size (diameter in the x-y plane) of the open apex 1527 can be selected based on the size of the beam 603, to, for example, ensure that only a small portion of the beam 603 is reflected from the side 626 toward the sensors 618a, 618b, 618c, 618d. When used as a spatial filter, the diameter of the open apex 1527 can vary from, for example, 0.7 millimeter (mm) to 1.5 mm. For applications other than a spatial filter, the diameter of the open apex 1527 can vary from 4 mm to 50 mm. Selecting the size of the open apex 1527 for a particular application can help to prevent or minimize saturation of the sensors 618a, 618b, 618c, 618d and also minimize the amount of light taken from the beam 603 through reflection from the side 626. The material of the side 1526 can be selected to be a material that reflects the wavelength of the beam 603.

By having the spatial filter 625 be removable, a single beam position sensor 610 can be adapted for use in a variety of different optical systems regardless of the wavelength or beam size used in the optical system. Additionally, the removable spatial filter 625 allows the beam position sensor 610 to be used in a single optical system under a variety of operating conditions.

Figure 7:
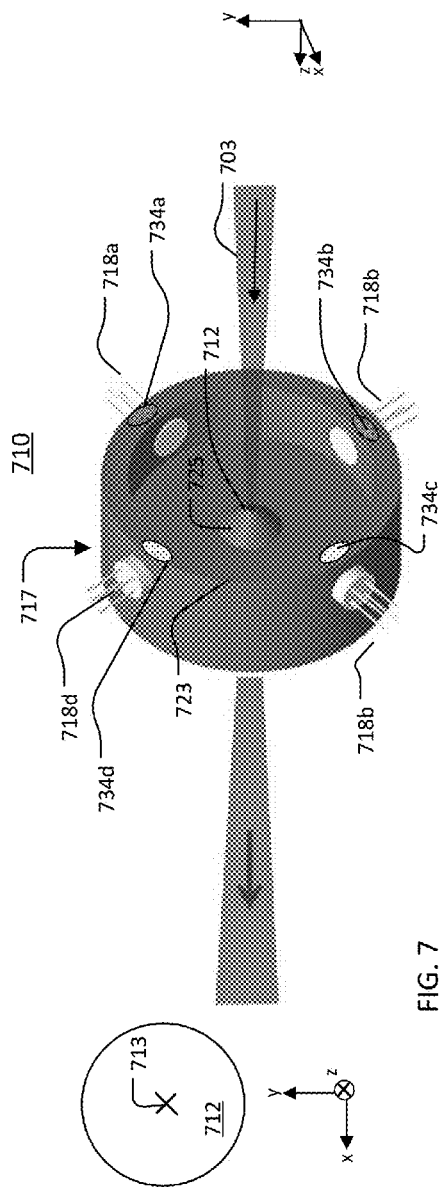

Referring to FIG. 7, a perspective view of another exemplary beam position sensor 710 is shown. The beam position sensor 710 determines a position of a beam 703 that passes through a region 712 defined by a spatial filter 725. The beam position sensor 710 is similar to the beam position sensor 510 (FIG. 5) except that sensors 718a, 718b, 718c, 718d are rotated 45 degrees (°) clockwise in the x-y plane relative to the configuration of the sensors 518a, 518b, 518c, 518d of the beam position sensor 510.

Additionally, the beam position sensor 710 includes visual indicators 734a, 734b, 734c, 734d on an outer surface of a cylindrical wall 723. The visual indicators 734a, 734b, 734c, 734d show the position of the beam 703 relative to each of the sensors 718a, 718b, 718c, 718d. For example, in an application in which the beam 703 is to be maintained at a center of the region 712, when the beam 703 moves away from the center in the −x direction, the visual indicators 734a and 734b can darken to indicate that the beam 703 has moved closer to the sensors 718a and 718b, and the visual indicators 734c and 734d can lighten to indicate that the beam 703 has moved away from the sensors 718c and 718d.

Figure 8:
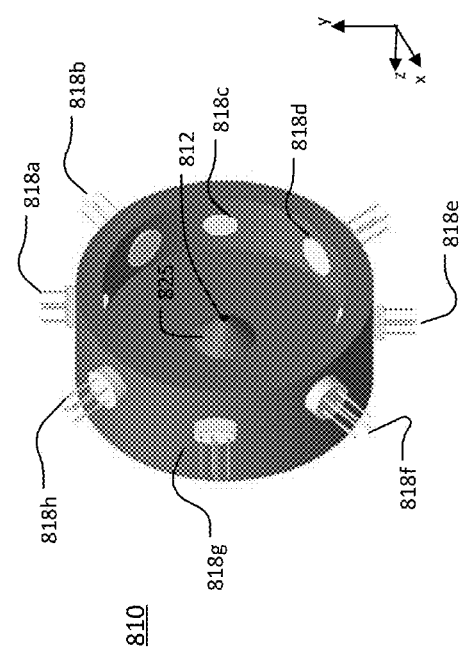

Referring to FIG. 8, a perspective view of another exemplary beam position sensor 810 is shown. The beam position sensor 810 is similar to the beam position sensor 510 (FIGS. 5A-5C), except that the beam positions sensor 810 includes eight sensors 818a-818h, four of which are sensitive to a first band of wavelengths and four of which are sensitive to a second band of wavelengths. At least some of the wavelengths in the first and second bands are different. Thus, the beam position sensor 810 can be used, for example, in an optical system that employs two different light sources that produce light of different wavelengths or a single light source that produces beams of different wavelengths.

Figure 2:
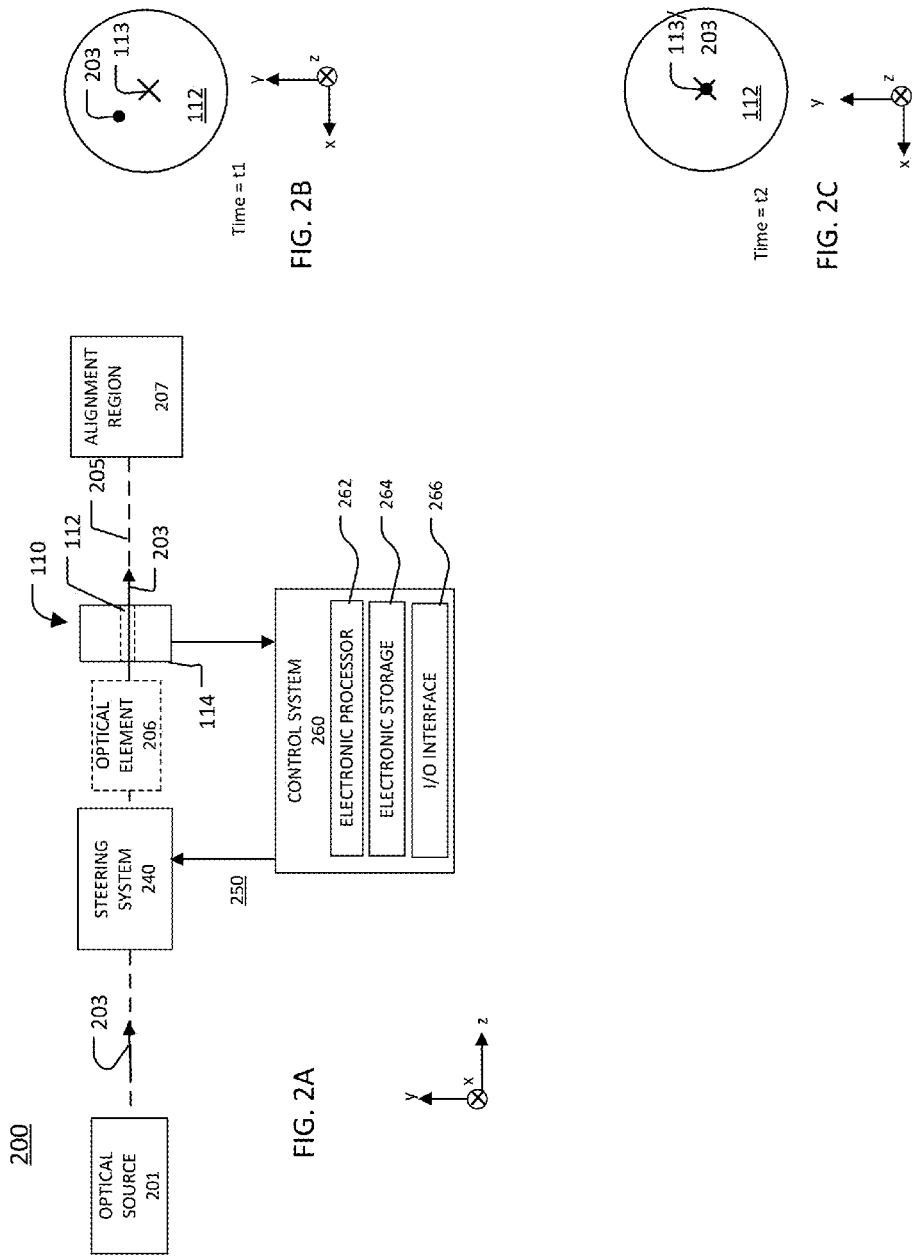
FIG. 2A is a block diagram of a side plan view of another exemplary optical system that includes the beam position sensor of FIG. 1A.
FIGS. 2B and 2C are optical axis views of a region of the beam position sensor of the system of FIG. 2A at two different times.
Figure 9:
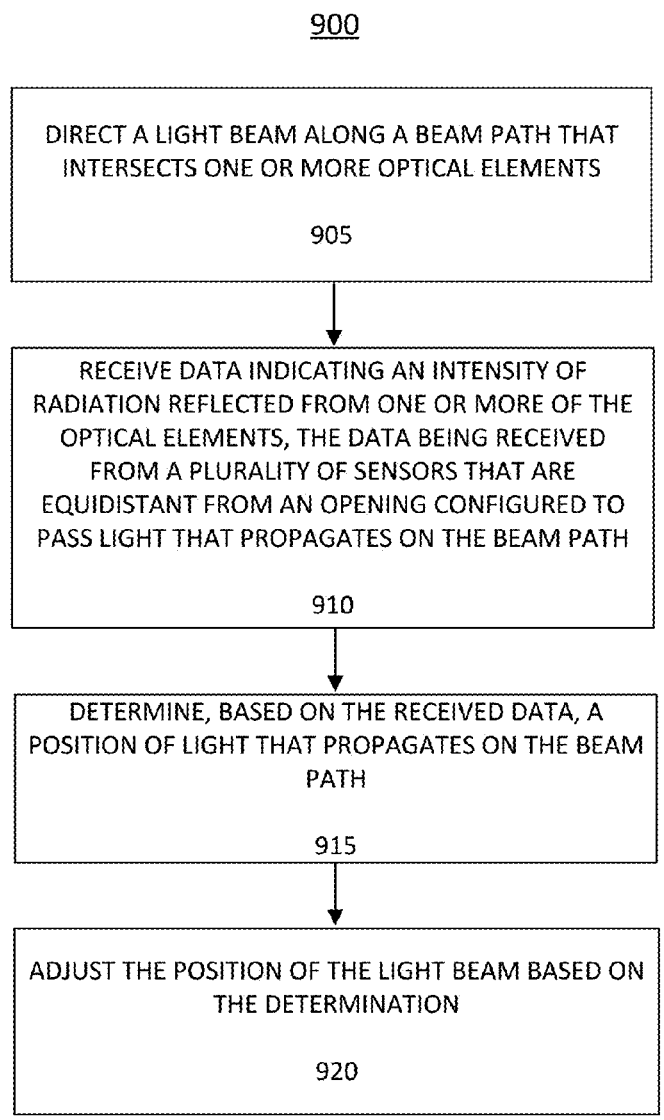
FIG. 9 is a flow chart of an exemplary process for determining a position of a light beam.

Referring to FIG. 9, a flow chart of an exemplary process 900 for determining a position of a light beam is shown. The process 900 can be performed by, for example, the control system 260 of FIG. 2. The process 900 is discussed with respect to the optical system 200, the beam position sensor 110 (FIGS. 1A, 1B, and 2A-2C), and the control system 260 (FIG. 2A). However, the process 900 can be used with a beam position sensor that is positioned in any optical system. For example, the beam position sensor 110 and the control system 260 can be used to determine a position of a light beam that propagates in an extreme ultraviolet (EUV) light source (FIG. 10), or in a deep ultraviolet (DUV) light source (FIG. 11). Additionally, the beam position sensor 110 can be implemented by any of the beam position sensors 410, 510, 610, 710, and 810. Examples of these implementations are also discussed below.

The light beam 203 is directed along the beam path 205 (905). Data indicative of an intensity of radiation reflected from one or more optical elements that intersect the beam path 205 is received (910). The data is received from a plurality of sensors (such as the sensors 118) that are in separate and distinct locations and are equidistant from the region 112. The plurality of sensors can be equidistant from the center 113 of the region 112.

The optical element that reflects the light beam 203 can be separate from the beam position sensor 210 or the optical element can part of the beam position sensor 210. In implementations that include the optical element 206, the beam 203 can be radiated, reflected or scattered from the optical element 206 (which is separate from the beam position sensor 210) and toward the beam position sensor 210. For example, the beam position sensor 210 can be similar to the beam position sensor 410 (FIGS. 4A and 4B) and the optical element 206 can be an element, such as the mirror 406 (FIG. 4A), that directs reflected light toward the beam position sensor 210.

In other examples, the optical element that reflects the light beam 203 is part of the beam position sensor 210. In these implementations, the beam position sensor 210 can be similar to the beam position sensors 410, 510, 610, 710, or 810, each of which include a spatial filter that reflects a portion of the light beam. In these implementations, light radiated, scattered or reflected by optical elements that are not part of the beam position sensor 110 also can be measured.

A position of the light beam 203 relative to the region 112 is determined based on the received data (915). The position of the light beam 203 in the x-y plane relative to the region 112 can be determined by comparing the intensity of the light sensed at each of the plurality of sensors 118. The beam position sensor 110 can have the plurality of sensors arranged with two sensors positioned to form a line along the x direction and two sensors positioned to form a line along the y direction, such as the sensors 418a, 418b, 418c, 418d of the beam position sensor 410 (FIGS. 4A and 4B) or the sensors 518a, 518b, 518c, 518d of the beam position sensor 510 (FIG. 5A). In these implementations, the position P=(Px,Py) of the light beam 203 in the x direction and the y direction relative to the center 113 of the region 112 can be determined from Equations 2 and 3, respectively:

$$Px = I_D - I_B \qquad \text{Equation (2).}$$

$$Py = I_A - I_C \qquad \text{Equation (3).}$$

In Equation (2), $I_D$ and $I_B$ are the intensities sensed by the sensors positioned along the x direction, with $I_B$ being in the x direction relative to the center of the region 112 and $I_D$ being in the −x direction relative to the center 113 of the region 112. The sensors 518d and 518b, respectively, of FIG. 5C are examples of sensors positioned to detect intensities $I_D$ and $I_B$. In Equation (3), $I_A$ and $I_C$ are the intensities sensed by the sensors positioned along the y direction, with $I_A$ being the intensity sensed by a sensor displaced relative to the center 113 of the region 112 in the y direction and $I_C$ being the intensity sensed by a sensor displaced relative to the center 113 of the region in the −y direction. The sensors 518a and 518c, respectively, of FIG. 5C are examples of sensors configured to detect intensities that can be used as $I_A$ and $I_C$.

In implementations in which the plurality of sensors are positioned at 45° from the x and y directions (such as the sensors 718a, 718b, 718c, 718d of the beam position sensor 710 shown in FIG. 7), the position P of the beam 203 in the x and y directions can be determined from Equations (4) and (5), respectively:

$$Px = (I_A + I_B) - (I_C + I_D) \qquad \text{Equation (4)}$$

$$Py = (I_A + I_D) - (I_B + I_C) \qquad \text{Equation (5).}$$

In Equation (4), $I_A$ and $I_B$ are intensities sensed by the sensors that are positioned in the −x direction relative to the center 113 of the region 112 through which light passes, and $I_C$ and $I_D$ are intensities sensed by the sensors that are positioned in the x direction relative to the center 113. Additionally, $I_A$ and $I_D$ are the intensities sensed by sensors that are positioned in the y direction relative to the center 113, and $I_B$ and $I_C$ are the intensities sensed by sensors that are positioned in the −y direction relative to the center 113. Using the beam position sensor 710 (FIG. 7) as an example, $I_A$ and $I_D$ are measured by the sensors 718a and 718d, respectively, and $I_B$ and $I_C$ are measured by the sensors 718b and 718c, respectively, and the position P of the beam 703 is determined relative to the center 713 of the region 712.

The position P of the beam 103 can be determined relative to other reference locations besides the center 113. For example, the position of the beam 103 can be determined relative to one of the plurality of sensors.

The position P of the light beam 203 is adjusted based on the determined position (920). The position of the light beam 203 can be adjusted by comparing the position of the light beam 203 determined in (915) to the reference location by subtracting the x and y coordinates of the determined position of the light beam from the x and y coordinates of the reference location. The center 113 can be represented as Px=0 and Py=0, thus, when the center 113 is used as the reference location the determined position P of the light beam 203 is the displacement of the light beam 203 from the center 113 in the x-y plane.

The position of the light beam 203 can be adjusted by providing the determined position of the light beam 203 or the position of the light beam 203 relative to the reference location to the steering system 240. The position can be provided as, for example, a voltage correction signal that has a magnitude that causes one of more optical components in the steering system to move by an amount that corresponds to the amount of correction needed to move the beam 203 to the reference location (such as the center 113 of the region 112). In response to the application of the correction signal to the steering system 240, the beam 203 moves in the x-y plane to the reference location (FIG. 2C).

In some implementations, the position of the beam 203 is determined again after adjusting the components of the steering system, and, if the beam 203 is not at the reference location, a second correction signal is determined and provided to the steering system. This feedback process can repeat until the beam 203 reaches the reference location. Additionally, the position of the beam 203 can be monitored in this manner continuously, periodically, or randomly over time to ensure that the beam 203 remains at the reference location during use of the optical system 200. Due to the configuration of the beam position sensor 110 and the region 112, which allows the beam 203 to pass, such monitoring can be achieved without interfering with the operation of the optical system 200.

Figure 10:
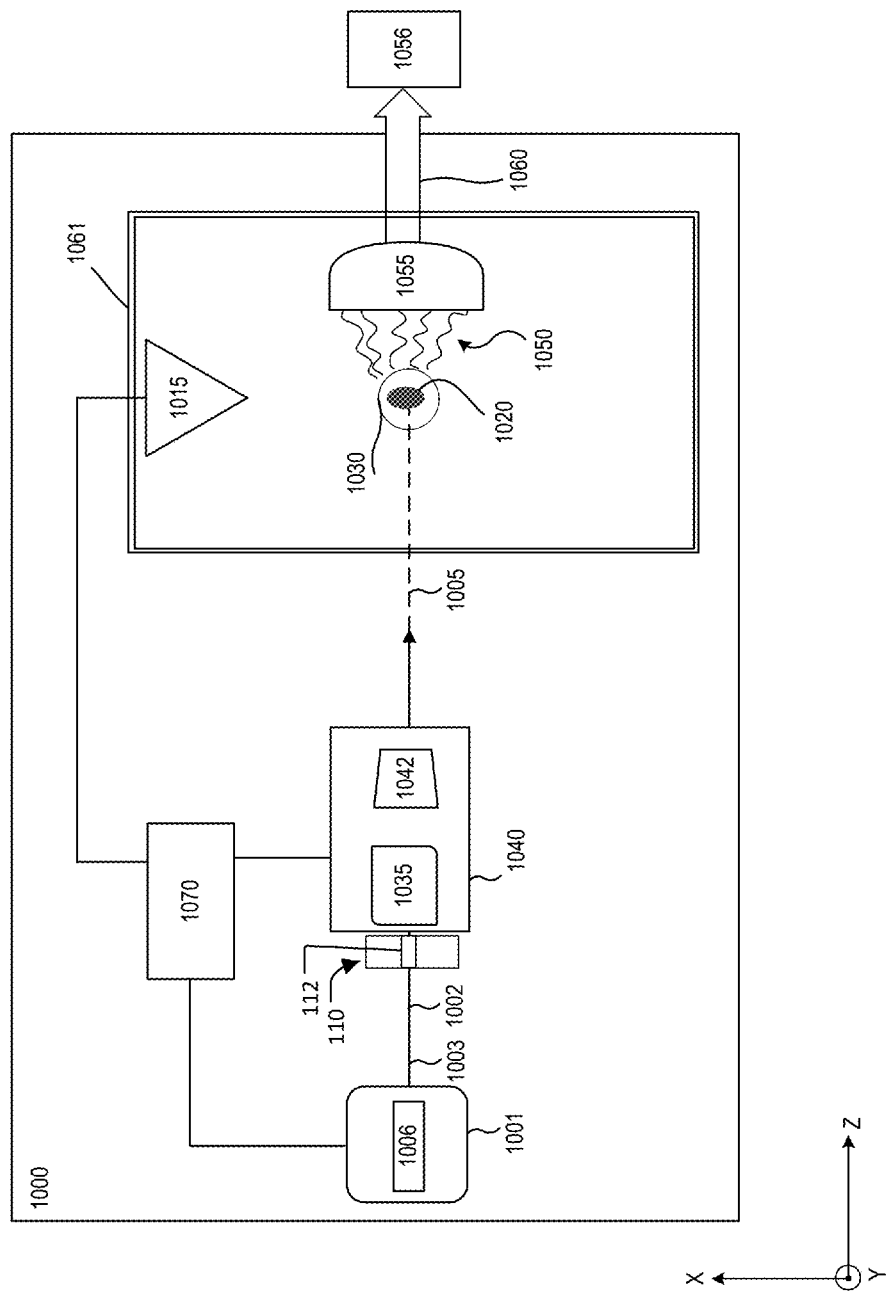
FIG. 10 is a block diagram of an exemplary extreme ultraviolet (EUV) light source that includes the beam position sensor of FIG. 1A.
Figure 11:
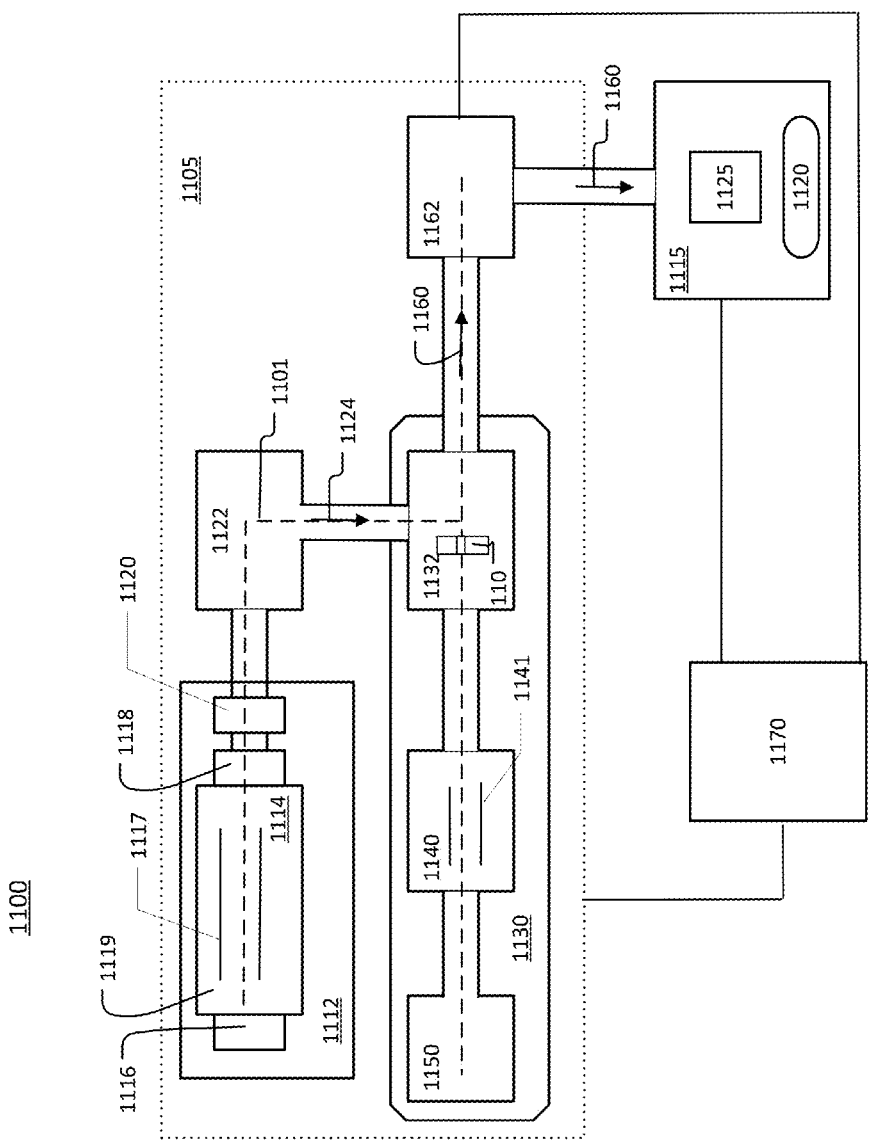
FIG. 11 is a block diagram of an exemplary optical lithography system that includes the beam position sensor of FIG. 1A.

FIGS. 10 and 11 are examples of optical systems in which the beam position sensor 110, 410, 510, 610, 710, or 810 can be used alone or in conjunction with the control system 260 (FIG. 2A). FIG. 10 is a block diagram of an exemplary extreme ultraviolet (EUV) light source 1000. FIG. 11 is a block diagram of an exemplary light source that is used in a photolithography system 200.

Referring to FIG. 10, an optical amplifier system 1006 forms at least part of an optical source 1001 (also referred to as a drive source or a drive laser) that is used to drive a laser produced plasma (LPP) extreme ultraviolet (EUV) light source 1000. The optical amplifier system 1006 includes at least one optical amplifier such that the optical source 1001 produces an amplified light beam 1003. The amplified light beam 1003 is provided to a target location 1030, which is inside of a vacuum chamber 1061. The term "amplified light beam" encompasses one or more of: light from the optical source 1001 that is merely amplified but not necessarily a coherent laser oscillation and light from the optical source 1001 that is amplified and is also a coherent laser oscillation. The optical amplifiers in the optical source 1001 can include as a gain medium a filling gas that includes $CO_2$ and can amplify light at a wavelength of between about 9100 and about 11000 nm, and in particular, at about 10600 nm, at a gain greater than or equal to 1000. Suitable amplifiers and lasers for use in the optical source 1001 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more.

The target location 1030 receives a target material 1020 from a target material supply system 1015. The target material 1020 can include, for example, water, tin, lithium, xenon, or any material that, when converted to a plasma state, has an emission line in the EUV range. For example, the element tin can be used as pure tin (Sn), as a tin compound, for example, $SnBr_4$, $SnBr_2$, $SnH_4$, as a tin alloy, for example, tin-gallium alloys, tin-indium alloys, tin-indium-gallium alloys, or any combination of these alloys. The target material 1020 can include a wire coated with one of the above elements, such as tin. If the target material 1020 is in a solid state, it can have any suitable shape, such as a ring, a sphere, or a cube.

An interaction between the amplified light beam 1003 and the target material 1020 produces plasma that emits EUV light or radiation 1050. A light collector 1055 collects and directs the EUV light 1050 as collected EUV light 1060 toward an optical apparatus 1065 such as a lithography tool.

The amplified light beam 1003 is directed toward the target location 1030 along a beam path 1005 by a beam delivery system 1040. The beam position sensor 110 is placed with the region 112 on the beam path 1005 so that, when the amplified light beam 1003 propagates in the z direction, the amplified light beam 1003 passes through the region 112 before reaching the beam delivery system 1040. The beam delivery system 1040 can include optical components 1035 and a focus assembly 1042 that focuses the amplified light beam 110 in or near the target location 1030. In other words, the focus assembly 1042 causes the radiation in the amplified light beam 1003 to converge as it propagates toward the target location 1030 in the z direction. In the absence of the target material 1020, the radiation in the amplified light beam 1003 diverges as the beam 1003 propagates away from the target location 1030 in the z direction.

The components 1035 can include optical elements, such as lenses and/or mirrors, which direct the amplified light beam 1003 by refraction and/or reflection. The components 1035 also can include elements that control and/or move the components 1035. For example, the components 1035 can include actuators that are controllable to cause optical elements of the beam delivery system 1040 to move. The positioning of the beam position sensor 110 allows the amplified light beam 1003 to be positioned prior to entering the beam delivery system 1040.

The light source 1000 also includes a control system 1070, which can receive data and signals from and provide data and signals to the optical source 1001, the beam delivery system 1040, the target material supply system 1015, and/or the beam position sensor 110. The control system 1070 can be used to control, for example the repetition rate of the optical source 1001, the position of the amplified light beam 1003 (based on information from the beam position sensor 110), and/or the components of the beam delivery system 1040.

In some implementations, the spatial distribution of the target material 1020 can be modified prior to the amplified light beam 1003 reaching the target location 1030. For example, the target material 1020 can be expanded from a droplet into a flat disk with a separate pulse of radiation (a "pre-pulse") 1002 that interacts with the target material 1020 before the amplified light beam 1003 interacts with the target material 1020. Increasing the size of the target material 1020 prior to the interaction with the amplified light beam 1003 can increase the portion of the target material 1020 that is exposed to the amplified light beam 1003, which can increase the amount of EUV light that is produced for a given amount of target material 120.

The pre-pulse 1002 can have the same wavelength as the amplified light beam 1003. For example, the amplified light beam 1003 and the pre-pulse 1002 can both have a wavelength of 10.6 microns (μm). In some implementations, the amplified light beam 1003 and the pre-pulse 1002 have different wavelengths. For example, the amplified light beam 1003 can have a wavelength of 10.6 μm and the pre-pulse 1002 can have a wavelength of 1.06 μm.

The pre-pulse 1002 and the amplified light beam 1003 can travel along the same path, different paths, or a path that partially overlaps. For example, and as shown in the example of FIG. 10, the amplified light beam 1003 and the pre-pulse 1002 can both be emitted from the optical source 1001 and can both propagate through the beam delivery system 1040. The pre-pulse 1002 and the amplified light beam 1003 can arrive at different locations in the x and/or y direction in the chamber 1061.

The beam position sensor 110 can be placed at any location along the beam path 1005. When positioned on a portion of the beam path 1005 on which the pre-pulse 1002 and the amplified light beam 1003 propagate, the beam position sensor 110 can be used to measure the position of both the pre-pulse 1002 and the amplified light beam 1010. In this example, the beam position sensor 110 can determine the position of the pre-pulse 1002 and the amplified light beam 1003 even if the pre-pulse 1002 and the amplified light beam 1003 have different wavelengths. For example, the beam position sensor 110 can be implemented to have features similar to the beam position sensor 810 (FIG. 8), which includes two different types of sensors, each of which are sensitive to a different wavelength.

In some implementations, the beam position sensor 110 includes a spatial filter, and the spatial filter can help to reduce or prevent back reflections from reaching the optical source 1001. Back reflections include light that propagates in the −z direction along the beam path 1005. Back reflections can arise from the interaction between the amplified light beam 1003 and the target material 1020, and the back reflections can degrade the performance of the optical source 1001 by stripping the gain medium of the amplifier 1006.

The beam position sensor 510 (FIG. 5A) can be used as the beam position sensor 110 with the spatial filter 525 of the beam position sensor 510 positioned such that the side 526 extends along the z direction toward the target location 1030. This arrangement can prevent or reduce the amount of back reflections that reach the light source 1001 and the amplifier 1006 by reflecting a portion of the back reflections that propagate in the −z direction out of the beam path 1005. Thus, such a positioning of the beam position sensor can improve the performance of the amplifier 1006 by reducing the amount of gain stripping that could otherwise be caused by the back reflections while also providing position information of the amplified light beam 1003 that propagates in the z direction.

Referring to FIG. 11, a block diagram of an exemplary photolithography system 1100 is shown. The system 1100 includes an exemplary light source 1105 that produces a pulsed light beam 1160, which propagates in the light source 1105 on a beam path 1101 (shown with a dashed line) and is provided to a lithography apparatus 1115. The system 1100 also includes a control system 1170 that is connected to components of the light source 1105 as well as to the lithography exposure apparatus 1115 to control various operations of the system 1100. The beam position sensor 110 can be used in the photolithography system 1100 and can be positioned anywhere along the beam path 1101.

The light source 1105 can be, for example, an excimer light source that outputs the pulsed light beam 1160 (which can be a laser beam). As the pulsed light beam 1160 enters the lithography apparatus 1115, it is directed through the projection optical system 1125 and projected onto the wafer 1121. In this way, one or more microelectronic features are patterned onto a photoresist on the wafer 1121 that is then etched and cleaned, and the process repeats.

In the example shown in FIG. 11, the light source 1105 is a two-stage laser system that includes a master oscillator (MO) 1112 that provides a seed light beam 1124 to a power amplifier (PA) 1130. The master oscillator 1112 enables fine tuning of parameters such as the center wavelength and the bandwidth at relatively low output pulse energies, for example, pulse energies of 1 to 1.5 millijoules (mJ) that are amplified by the power amplifier 1130 to about 10 to 15 mJ. The power amplifier 1130 receives the seed light beam 1124 from the master oscillator 1112 and amplifies the seed light beam 1124 to generate the light beam 1160 for use in the lithography apparatus 1115.

The master oscillator 1112 includes a discharge chamber 1114 having two elongated electrodes 1117, a gain medium 1119 that is a gas mixture, and a fan or blower for circulating gas between the electrodes 1117. A resonator is formed between a line narrowing module 1116 on one side of the discharge chamber 1114 and an output coupler 1118 on a second side of the discharge chamber 1114. The line narrowing module 1116 can include a diffractive optic such as a grating that finely tunes the spectral output of the discharge chamber 1114. The master oscillator 1112 also includes a line center analysis module 1120 that receives an output light beam from the output coupler 1118 and a beam modification optical system 1122 that modifies the size or shape of the output light beam as needed to form the seed light beam 1124. The line center analysis module 1120 is a measurement system that can be used to measure or monitor the wavelength of the seed light beam 1124. The line center analysis module 1120 can be placed at other locations in the light source 1105, or it can be placed at the output of the light source 1105.

The gas mixture used in the discharge chamber 1114 can be any gas suitable for producing a light beam at the wavelength and bandwidth required for the application. For example, for an excimer source, the gas mixture can contains a noble gas (rare gas) such as, for example, argon, krypton, or xenon and a halogen, such as, for example, fluorine or chlorine, apart from helium and/or neon as buffer gas. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 1117.

The power amplifier 1130 includes a beam modification optical system 1132 that receives the seed light beam 1124 from the master oscillator 1112 and directs the light beam through a discharge chamber 1140, and to a beam turning optical element 1152, which modifies or changes the direction of the seed light beam 1124 so that it is sent back into the discharge chamber 1140.

The discharge chamber 1140 includes a pair of elongated electrodes 1141, a gain medium 1149 that is a gas mixture, and a fan for circulating the gas mixture between the electrodes 1141.

The output light beam 1160 is directed through a bandwidth analysis module 1162, where various parameters (such as the bandwidth or the wavelength) of the beam 1160 can be measured. The output light beam 1160 can also be directed through a pulse stretcher, where each of the pulses of the output light beam 1160 is stretched in time, for example, in an optical delay unit, to adjust for performance properties of the light beam that impinges the lithography apparatus 115.

The control system 1170 is connected to various components of the light source 1105 and can also be connected to the beam position sensor 110 to control the position of the beam 1160. For example, the control system 1170 is coupled to the electrodes 1117, 1141 within the master oscillator 1112 and the power amplifier 1130, respectively, for controlling the respective pulse energies of the master oscillator 1112 and the power amplifier 1130, and also for controlling the pulse repetition rates, which can range between about 500 and 12,000 Hz or greater. The control system 1170 therefore provides repetitive triggering of the discharges in the chamber of the master oscillator 1112 and the discharges in the chamber of the power amplifier 1130 relative to each other with feedback and feed-forward control of the pulse and dose energy. The repetitively-pulsed light beam 1160 can have an average output power of between a few watts and hundreds of watts, for example, from about 40 W to about 200 W. The irradiance (that is, the average power per unit area) of the light beam 1160 at the output can be at least about 60 W/cm$^2$ or at least about 80 W/cm$^2$.

The output power of the light source 1105 can be calculated at 100% duty cycle (that is, the continuous firing of the electrodes in the master oscillator 1112 and the power amplifier 1130 of the light source 1105) at a nominal pulse repetition rate and a nominal pulse energy. Thus, for example, at a nominal pulse repetition rate of 6000 Hz and a 15 mJ nominal pulse energy, the output power of the light source 1105 (which is the power of the light beam 1160) is 90 W. As another example, at a nominal pulse repetition rate of 6000 Hz and a 20 mJ nominal pulse energy, the output power of the light source 1105 (which is the power of the light beam 1160) is 120 W.

Additionally, the control system 1170 controls when the light source 1105 emits a pulse of light or a burst that includes one or more pulses of light by sending one or more signals to the light source 1105. The light beam 1160 can include one or more bursts that are separated from each other in time. Each burst can include one or more pulses of light.

In some implementations, a burst includes hundreds of pulses, for example, 100-400 pulses.

As discussed above, when the gain medium 1119 is pumped by applying voltage to the electrodes 1117, the gain medium 1119 emits light. When voltage is applied to the electrodes 1117 in pulses, the light emitted from the medium 1119 is also pulsed. Thus, the repetition rate of the pulsed light beam 1160 is determined by the rate at which voltage is applied to the electrodes 1117, with each application of voltage producing a pulse of light. The pulse of light propagates through the gain medium 1119 and exits the chamber 1114 through the output coupler 1118. Thus, a train of pulses is created by periodic, repeated application of voltage to the electrodes 1117.

Other implementations are within the scope of the following claims.

What is claimed is:

1. A system comprising:
a plurality of sensors at distinct and separate locations, each of the distinct and separate locations being equidistant from a region that is configured to pass light that propagates along a beam path, and the sensors being configured to sense radiation that passes through the region, the sensed radiation being a reflection of light from an optical element positioned to interact with light that propagates on the beam path, wherein the light that propagates on the beam path is a light beam configured to interact with target material that emits extreme ultraviolet (EUV) light when in a plasma state, the EUV light being distinct from the light that propagates on the beam path and from the reflection; and
a controller comprising one or more electronic processors and a computer-readable medium, the computer-readable medium comprising instructions that, when executed, cause the one or more electronic processors to:
receive an output from each of the sensors, the output of each sensor comprising an indication of an intensity of the radiation detected by the sensor, and
analyze the received output to determine a position of the light that propagates along the beam path.

2. The system of claim 1, wherein the instructions to analyze the received output to determine a position of the light that propagates on the beam path comprise instructions that analyze the received output to determine the position of the light that propagates on the beam path relative to the region.

3. The system of claim 1, wherein the instructions to analyze the received output to determine a position of the light that propagates on the beam path comprise instructions that analyze the received output to determine the position of the beam path relative to a center of the region.

4. The system of claim 3, wherein the plurality of sensors are positioned along a circumference, with each sensor being radially equidistant from the center of the region.

5. The system of claim 1, wherein the plurality of sensors are positioned along a circumference, with each sensor being equally spaced along the circumference.

6. The system of claim 1, wherein the plurality of sensors comprises at least four sensors, and the instructions to analyze the received output comprise instructions to:
determine a first coordinate of the position of the light that propagates on the beam path relative to the region based on the output of two sensors in a first set of sensors, and
determine a second coordinate of the position of the light that propagates on the beam path relative to the region based on the output of two sensors in a second set sensors, the first set of two sensors comprising two of the at least four sensors and the second set of two sensors comprising a different two of the at least four sensors.

7. The system of claim 6, wherein the two sensors of the first set of sensors are positioned on opposite sides of the region along a first direction and two sensors of the second set of sensors are positioned on opposite sides of the region along a second direction perpendicular to the first direction.

8. The system of claim 1, further comprising a spatial filter, the spatial filter comprising a filter opening configured to pass light that propagates along the beam path.

9. The system of claim 8, wherein the region comprises a support that defines an opening, and the spatial filter is received in the opening.

10. The system of claim 9, wherein the location of each of the plurality of sensors is equidistant from a center of the filter opening.

11. The system of claim 9, wherein the spatial filter is removably received in the opening of the support.

12. The system of claim 9, wherein the spatial filter comprises sides that extend from the filter opening at angle relative to an axis that intersects the region, a portion of the filter opening coinciding with a center of the opening of the support, the sides slanting toward the axis.

13. The system of claim 9, wherein the optical element positioned to interact with light that propagates along the beam path is the spatial filter, and the sensors are configured to sense light that is reflected from the spatial filter.

14. The system of claim 1, wherein the instructions comprise instructions that, when executed, cause the one or more processors to:
compare the determined position of the beam path to a baseline position,
generate a control signal based on the comparison, and
adjust the position of the beam path based on the control signal.

15. The system of claim 1, wherein
the sensors comprise at least one sensor that is configured to detect a first wavelength, and at least one sensor that is configured to detect a second wavelength that is different from the first wavelength, and
the light that propagates on the beam path comprises the first wavelength or the second wavelength, the light having the first wavelength having an energy sufficient to change a geometric distribution of the target material and the light having a second wavelength having an energy sufficient to convert at least some of the target material to the plasma that emits EUV light.

16. The system of claim 15, wherein the first wavelength comprises a wavelength produced by a carbon dioxide laser, and the at least one sensor configured to detect the first wavelength comprises a thermopile.

17. A method comprising:
directing a light beam along a beam path that intersects one or more optical elements positioned between a target region and a source of the light beam;
receiving data indicating an intensity of radiation reflected from one or more of the optical elements that intersect the beam path, the data being received from a plurality of sensors that are in separate and distinct locations and equidistant from a beam region that is configured to pass light that propagates along the beam path, wherein the light beam directed along the beam path interacts with target material at the target region, the target material emits EUV light when in a plasma state, and the radiation reflected is distinct from the EUV light;
determining, based on the received data, a position of light that propagates on the beam path relative to the beam region; and
adjusting the position of the light beam based on the determined position.

18. The method of claim 17, wherein the light beam directed along the beam path comprises an amplified light beam having an energy sufficient to convert the target material to the plasma state or a pre-pulse light beam having an energy sufficient to change a geometric distribution of the target material.

19. The method of claim 17, wherein the data indicating an intensity of radiation from one or more of the optical elements comprises data indicating an intensity of light reflected from one or more of the optical elements.

20. The method of claim 17, wherein determining a position of the beam path relative to the beam region comprises determining a first coordinate that represents the position of light that propagates on the beam path in one dimension and a second coordinate that represents the position of the beam path in a second dimension.

21. The method of claim 17, further comprising comparing the determined position of light that propagates on the beam path to a baseline position.

22. The method of claim 21, further determining an amount of correction based on the comparison.

23. The method of claim 22, wherein adjusting the beam path based on the determined position comprises generating a control signal that, when applied to any one of the optical elements positioned between the target region and the source of the amplified light beam, moves the optical element by an amount that causes the beam path to move relative to the beam region by the amount of correction.

24. The method of claim 22, wherein
the amount of correction comprises an amount of correction in two orthogonal directions, and
adjusting the beam path based on the determined position comprises generating a control signal that, when applied to two of the optical elements positioned between the target region and the source of the amplified light beam, moves the two optical elements by an amount that causes the beam path to move in the two orthogonal directions relative to the region by the amount of correction.

25. A device for an optical system, the device comprising:
a mount comprising a through-hole and a plurality of sensors positioned at distinct and separate locations along a perimeter of the mount, the plurality of sensors being equidistant from a center of the through-hole; and
a filter received in the through-hole, the filter comprising sides that extend from an opening that coincides with the center of the through-hole, wherein
an outer surface of the sides comprises an optically reflective material,
the sides extend from the opening at an angle relative to an axis that passes through the opening, and
the sensors are configured to detect light reflected from the outer surface of the sides.

26. The device of claim 25, wherein the filter is removeably received in the through-hole.

27. The device of claim 25, wherein the sensors are oriented toward the axis that passes through the opening.

28. A device for reducing back reflections in an EUV light source, the device comprising:
a mount comprising a through-hole;
a plurality of sensors positioned at distinct and separate locations along a perimeter of the mount, the plurality of sensors being equidistant from a center of the through-hole; and
a filter received in the through-hole, the filter comprising sides that extend from an opening that coincides with the center of the through-hole, wherein
an outer surface of the sides comprises an optically reflective material,
the sides extend from the opening at an angle relative to an axis that passes through the opening such that light propagating in a first direction along a beam path that coincides with the axis passes through the hole and light propagating in a second and different direction along the beam path is reflected away from the beam path by the outer surface, and
wherein, in operational use, the device is on the beam path between a target region that receives target material and an optical source that produces the light that propagates in the first direction on the beam path such that a reflection of the light from the target region is directed away from the beam path through an interaction between the reflection and the outer surface of the sides of the filter.

29. The device of claim 28, wherein, in operational use, the outer surface of the sides of the filter extend from the opening at the angle away from the axis and toward the optical source.

30. A system comprising:
a plurality of sensors at distinct and separate locations, each of the distinct and separate locations being equidistant from a region that is configured to pass light that propagates along a beam path, and the sensors being configured to sense radiation that passes through the region, the sensed radiation being a reflection of light from an optical element positioned to interact with light that propagates on the beam path, wherein the location of each of the plurality of sensors is equidistant from a center of the filter opening;
a spatial filter, the spatial filter comprising a filter opening configured to pass light that propagates along the beam path, wherein the region comprises a support that defines an opening, and the spatial filter is received in the opening, and the spatial filter comprises sides that extend from the filter opening at an angle relative to an axis that intersects the region, a portion of the filter opening coinciding with a center of the opening of the support, the sides slanting toward the axis; and
a controller comprising one or more electronic processors and a computer-readable medium, the computer-readable medium comprising instructions that, when executed, cause the one or more electronic processors to:
receive an output from each of the sensors, the output of each sensor comprising an indication of an intensity of the radiation detected by the sensor, and
analyze the received output to determine a position of the light that propagates along the beam path.

* * * * *